(12) United States Patent  
Botker

(10) Patent No.: US 8,742,848 B1
(45) Date of Patent: Jun. 3, 2014

(54) COMMON MODE REJECTION RATIO VERSUS FREQUENCY IN INSTRUMENTATION AMPLIFIER

(71) Applicant: Linear Technology Corporation, Milpitas, CA (US)

(72) Inventor: Thomas Lloyd Botker, Andover, MA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 13/829,567

(22) Filed: Mar. 14, 2013

(51) Int. Cl.
*H03F 3/45* (2006.01)

(52) U.S. Cl.
USPC .......................................... 330/258; 330/260

(58) Field of Classification Search
USPC .................................. 330/258, 252, 261, 260
See application file for complete search history.

(56) References Cited

U.S. PATENT DOCUMENTS

| 7,049,875 | B2* | 5/2006 | Tsividis | 327/308 |
| 7,205,839 | B2* | 4/2007 | Luo et al. | 330/258 |
| 8,138,839 | B2* | 3/2012 | Gupta et al. | 330/311 |
| 8,489,052 | B2* | 7/2013 | Bult et al. | 455/252.1 |

* cited by examiner

*Primary Examiner* — Henry Choe
(74) *Attorney, Agent, or Firm* — Patent Law Group LLP; Brian D Ogonowsky

(57) ABSTRACT

A method of fabricating an instrumentation amplifier to have an improved common mode rejection ratio (CMRR) vs. frequency initially trims resistors in the input amplifiers of the instrumentation amplifier during a DC test, where the inputs are shorted and a DC voltage is applied, so that the output of the amplifier is approximately zero. This will normally cause the transconductances of the two input amplifiers to be different. Thus, the AC CMRR will degrade with frequency. Trimmable capacitors are provided in the input section and are trimmed during a common mode AC test to cause the output voltage to be minimized during the AC test. This causes the two input amplifiers to have the same bandwidth and gm/C ratio.

18 Claims, 2 Drawing Sheets

COMMON MODE REJECTION RATIO VERSUS FREQUENCY IN INSTRUMENTATION AMPLIFIER

FIELD OF THE INVENTION

This invention relates to instrumentation amplifiers and, in particular, to a technique for improving the AC common mode rejection ratio (CMRR) in such amplifiers.

BACKGROUND

Instrumentation amplifiers receive differential and common mode input signals and amplify the differential signals. Ideally, the common mode signals are cancelled (rejected) but, due to the non-ideal nature of an actual instrumentation amplifier, the common mode signals are not completely rejected.

Instrumentation amplifiers often contain two input amplifiers, sometimes referred to as positive and negative input amplifiers. The terms positive (processes the non-inverted signal) and negative (processes the inverted signal) are used simply to refer to the different inputs of the instrumentation amplifier. The input amplifiers are ideally identical. The instrumentation amplifier also includes an output section, which is typically an operational amplifier (op amp) that receives the differential and common mode signals from the input amplifiers, removes the common mode, and outputs a voltage corresponding to the difference between the input signals of the instrumentation amplifier. Thus, the instrumentation amplifier cancels (or rejects) signals common to both input signals, such as noise or common mode AC or DC inputs.

The common-mode rejection ratio (CMRR) of a differential amplifier measures the tendency of the device to reject input signals common to both input signals. A high CMRR is important in applications where the differential signal of interest is represented by a small voltage fluctuation superimposed on a possibly large common mode voltage. The CMRR is the ratio of powers of the differential gain over the common-mode gain, expressed in positive decibels.

In an ideal instrumentation amplifier, for near infinite AC CMRR, the positive and negative input amplifiers should be perfectly matched. However, this is practically impossible due to process variations and component tolerances. Consequently, the characteristics of both input amplifiers may change differently over a frequency range.

There are resistors, or other current source elements, in both input amplifiers. The conventional technique to match both input amplifiers is simply to trim one or more of the resistors so that a shorted DC differential input is ideally cancelled at the output. This will result in a zero DC input offset voltage.

Since instrumentation amplifiers are commonly used in precision measuring equipment, the CMRR must be especially good. The inventor has found that the conventional technique of just trimming one or more resistors during a DC test does not optimize the CMRR over a wide range of frequencies, since the bandwidths of the positive and negative input amplifiers may deviate over a range of frequencies. Accordingly, what is needed is an improved technique for adjusting the characteristics of the positive and negative input amplifiers of a precision instrumentation amplifier so that the CMRR remains excellent over a wide frequency range.

SUMMARY

The bandwidths of the positive and negative input amplifiers of an instrumentation amplifier typically differ due to mismatches. In the context of this disclosure, equal bandwidths of the input amplifiers means that the gains of the input amplifiers are equal over the frequency range of interest, even though the gains may attenuate as the frequency increases. The bandwidth of interest may be arbitrarily set. If the gains are matched over the frequency range, the CMRR vs. frequency will be very high. In an instrumentation amplifier, it is desirable to have a high CMRR over a wide bandwidth.

One embodiment of the invention relates to a trimming and testing technique during the testing and trimming stage of the fabrication of an integrated circuit instrumentation amplifier. However, the invention is also applicable to other types of amplifiers receiving differential inputs and generating differential output signals or generating differential intermediate signals.

In an example of an instrumentation amplifier, there is an input section, where differential and common mode input signals are applied to positive and negative input amplifiers in the input section, and a voltage is output from each input amplifier. These voltage outputs from the input amplifiers are then applied to a difference amplifier output section (including an op amp), whose output provides the output for the instrumentation amplifier. The input amplifiers provide a high input impedance and thus make the instrumentation amplifier particularly suitable for use in test and measurement equipment. Other benefits include low DC offset voltage, adjustable gain, and high CMRR.

The instrumentation amplifier first undergoes a DC offset voltage test and resistor-trim routine to create a minimum DC output when the inputs are shorted. Assuming the input devices are bipolar transistors, the areas of the transistor emitters and other physical characteristics are not exactly equal due to process variations. Therefore, the Vbe's of the input bipolar transistors are usually not matched. The Vbe's are set to be equal by adjusting the currents through each of the input bipolar transistors by trimming current source resistors for the input bipolar transistors. This is a conventional step, and trimming may be done with a laser or other means. Since the currents through the input bipolar transistors may not be equal, the transconductances (gm's) of the input amplifiers may not be equal.

The output stage of the instrumentation amplifier receives the voltage outputs from the input amplifiers and includes resistors and an op amp. This op amp provides the output Vout of the instrumentation amplifier. To make Vout zero when the common mode DC signal is applied to the shorted inputs of the input amplifiers, one or more resistors in the output section of the instrumentation amplifier are trimmed.

In this manner, the instrumentation amplifier has excellent CMRR at DC.

However, even though the output voltage Vout may be zero for a common mode DC input, the output voltage Vout may not be zero for a given common mode AC input due to the gm's of the input amplifiers not being equal.

In the prior art, an AC test is typically not performed since all components affecting the AC operation are assumed to be equal in both input amplifiers. For example, if capacitors are used in the input section for compensation to prevent oscillations, the capacitors are formed to be of equal value. However, the inventor has found that the CMRR performance still degrades with frequency.

In one embodiment, the inventive process performs the following AC test.

At least one compensation capacitor (C) in the input amplifiers is made trimmable, such as by using a laser to cut fuse links or using other techniques. An AC input signal is applied to shorted inputs of the input amplifiers. In one embodiment, the common mode AC frequency is set to a point within the specified bandwidth of the instrumentation amplifier in the data sheet. For example, the specified bandwidth may be 2 MHz, and the AC frequency used during the test is set for 100 KHz. The AC frequency is set lower than the specified bandwidth yet set high enough so that the CMRR is low enough to easily measure.

The transconductances (gm's) of the input amplifiers differ when amplifying a common mode AC signal, resulting in a difference voltage at the outputs of the input amplifiers at a given frequency with a common mode AC input. Therefore, the CMRR value at the AC test frequency will be degraded.

The inventor has discovered that matching the gm/C ratio of both input amplifiers results in improved CMRR vs. frequency. This causes each input amplifier to have the same bandwidth. Since the gm's are different, the compensation capacitors must be trimmed to have different values (in contrast with the conventional technique of matching the capacitors). As a result of the proper trimming of the capacitors during the AC test, the overall gains of both input amplifiers over a broad range of AC frequencies will be substantially equal, the CMRR vs. frequency is improved (e.g., by an order of magnitude), and Vout will be minimized for a common mode AC signal after the trimming.

Trimming the capacitors does not affect the CMRR for DC inputs.

The invention may be applied to instrumentation amplifiers that trim components for current feedback as well as voltage feedback.

The technique of trimming capacitors to match the gm/C ratio of both input amplifiers during an AC test may be applied to other types of instrumentation amplifiers. The instrumentation amplifier may generate a single-ended output or a differential output.

DETAILED DESCRIPTION

Figure 1:
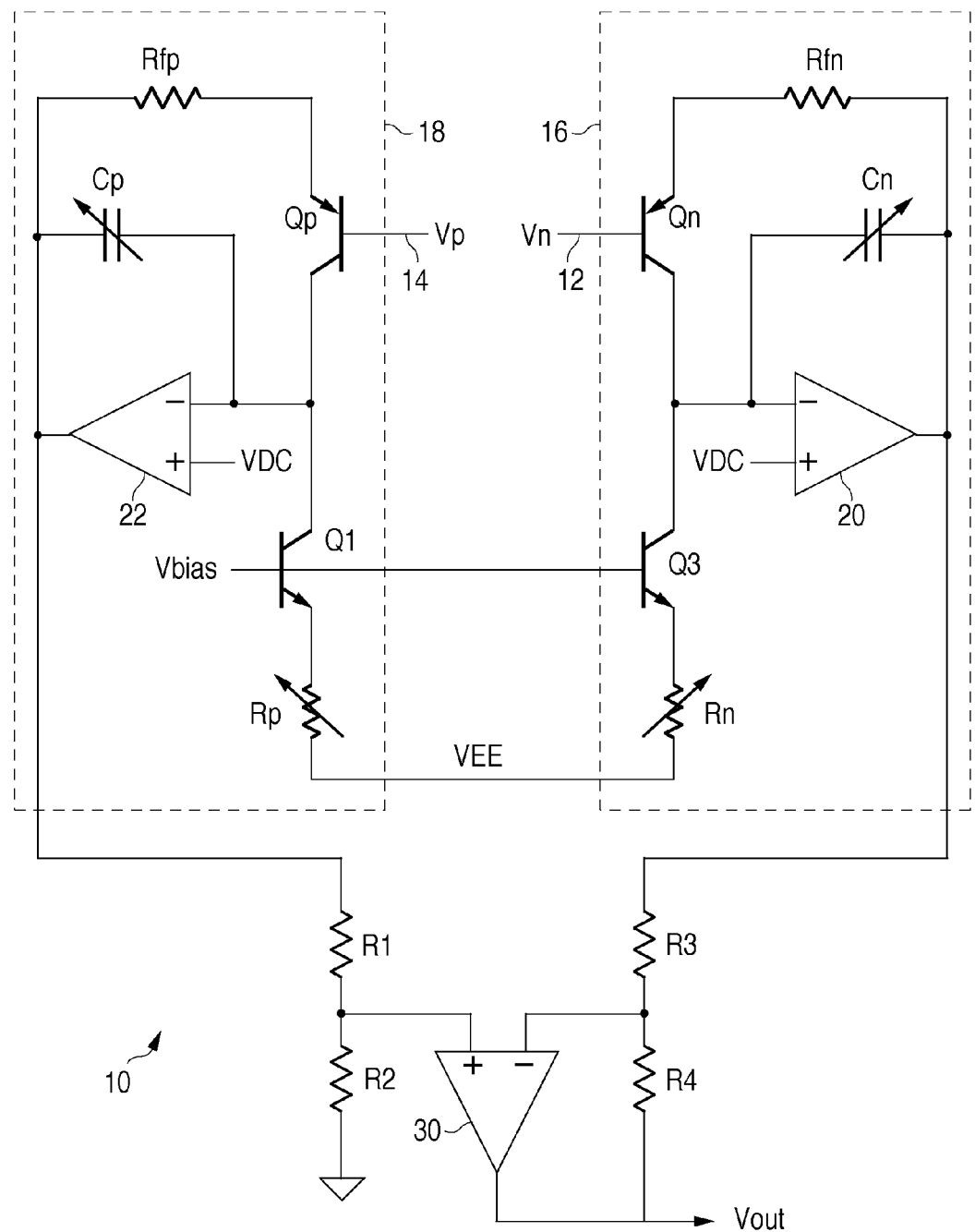
FIG. 1 illustrates a representative instrumentation amplifier with one or more trimmable capacitors and one or more trimmable resistors for optimizing CMRR vs. frequency.

FIG. 1 is a schematic diagram of an instrumentation amplifier 10 having an inverting (or negative) input 12 receiving a voltage signal Vn (referred to as a negative input voltage), and a non-inverting (or positive) input 14 receiving a voltage signal Vp (referred to as a positive input voltage). Vn and Vp contain common mode and differential components and may be DC or AC signals. It is desirable for the amplifier 10 to exhibit a high CMRR over the full frequency range of the amplifier 10 since the amplifier 10 is used for precision measurement.

The negative side of the amplifier 10 has an input amplifier 16, and the positive side has an input amplifier 18. The input amplifiers 16 and 18 include current source NPN transistors Q3 and Q1, having a fixed DC bias voltage Vbias coupled to their bases, and trimmable resistors Rn and Rp for setting the currents through the transistors Q3 and Q1. PNP transistors Qn and Qp are controlled by the input signals Vn and Vp. Feedback circuits consist of op amps 20 and 22, trimmable compensation capacitors Cn and Cp, resistors Rfn and Rfp, and the transistors Qn and Qp feeding back to the inverting inputs of op amps 20 and 22. Rfn and Rfp are typically trimmable. The op amps 20 and 22 are a type of differential amplifier. The compensation capacitors Cn and Cp prevent oscillations at high frequencies by attenuating the gain at the high frequencies. The op amps 20 and 22 output a voltage necessary to substantially maintain their inverting inputs at the voltage VDC, where VDC is a fixed voltage applied to their non-inverting inputs. The output voltages of the op amps 20 and 22 will track (or amplify) the input voltages Vn and Vp, and the compensation capacitors Cn and Cp determine the rolloff vs. frequency. The outputs of the op amps 20 and 22 are the output voltages of the input amplifiers 16 and 18, respectively.

The output of the input amplifier 18 is connected to a resistor divider consisting of resistors R1 and R2, typically connected to ground, and the divided voltage is coupled to the non-inverting input of an output op amp 30. The output of the input amplifier 16 is connected to the inverting input of op amp 30 via resistor R3, and the output of the op amp 30 is fed back to its inverting input via resistor R4. The output of the op amp 30 provides the output of the instrumentation amplifier 10.

The resistors R1-R4 and the op amp 30 constitute the output stage. The gain of the output stage is set by controlling the ratio of the values of resistors R1-R4. The gain is typically set to one and trimmed for optimizing the DC CMRR. For example, R2/R1=R4/R3.

The output Vout of the op amp 30 adjusts to cause the inverted input to equal the divided output voltage of the input amplifier 18. Any common mode signal at the inputs of op amp 30 is cancelled out by the differential nature of the op amp 30. Therefore, Vout adjusts to be directly proportional to the difference between the input signals Vp and Vn.

The user may control the gain of the instrumentation amplifier 10 to be greater than one by connecting an external resistor (Rg, not shown) between the emitters of the transistors Qp and Qn. The gain is determined by the ratio of Rg to Rfp and Rfn, so the values of the internal resistors Rfp and Rfn must be trimmed to be a known absolute value to minimize gain error.

All of the resistors R1-R4 may be trimmable to achieve the optimal CMRR when Vp and Vn are tied to a common DC signal during the test and trim stage of fabrication. The values of resistors R1-R4 may all be the same. The entire amplifier 10 may be formed on a single chip.

Figure 2:
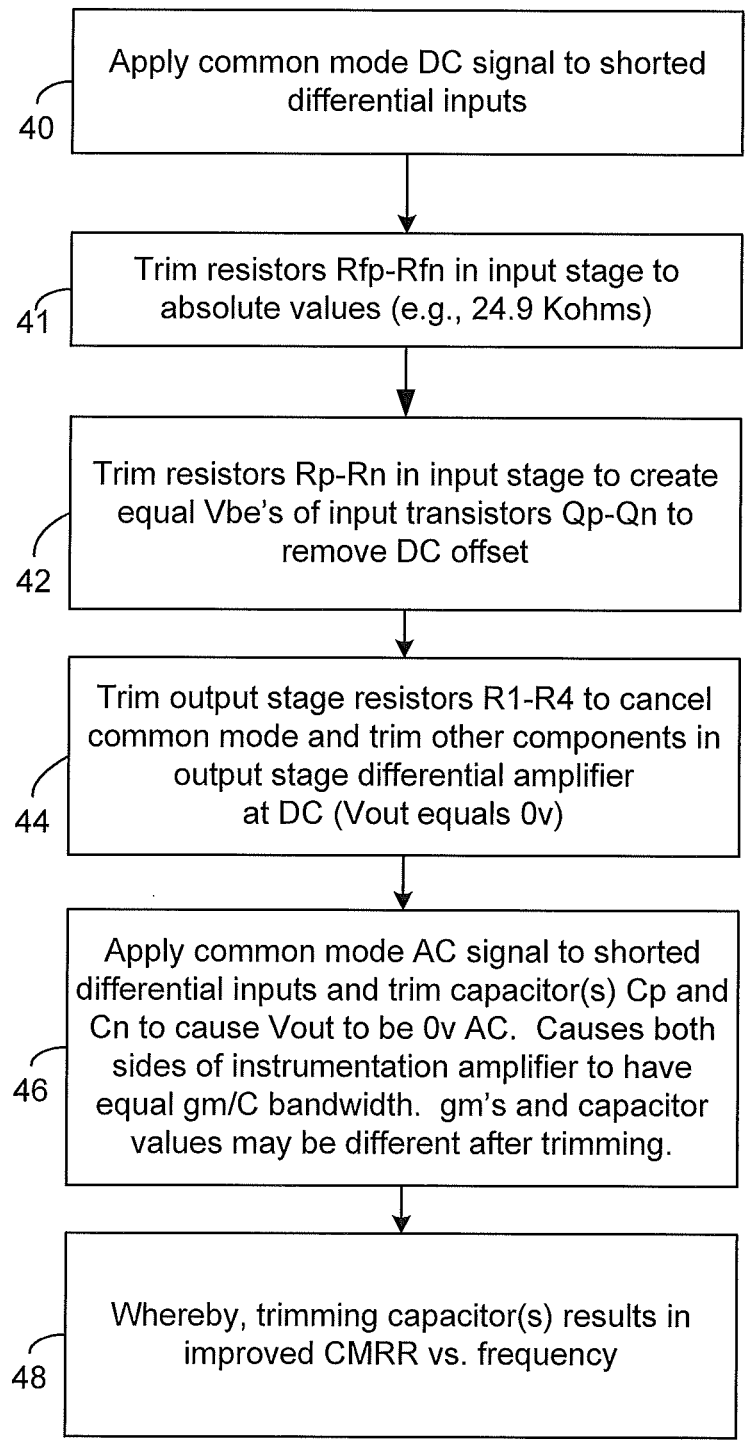
FIG. 2 is a flowchart identifying various steps to improve the CMRR vs. frequency of the instrumentation amplifier of FIG. 1.

FIG. 2 is a flowchart illustrating steps that may be performed on amplifier 10 to achieve an improved CMRR vs. frequency performance. All hardware aspects of the amplifier 10 may be conventional except for the addition of the trimmable capacitors in the feedback loop for controlling the bandwidths of the negative and positive input amplifiers 16 and 18 of the amplifier 10.

In step 40, the differential inputs are shorted and a common mode DC voltage is applied.

In step 41, the resistors Rfp and Rfn are trimmed to have a precise absolute value (e.g., 24.9 Kohms). This is needed in order for the gain of the instrumentation amplifier 10 to be precisely set by the user using an external resistor (not shown) connected between the emitters of the transistors Qp and Qn, where the gain is determined by the ratio of the external resistor to the resistors Rfp and Rfn. Any trimming may be performed with fuse links using lasers, or any other conventional methods.

In step 42, one or both of the resistors Rp and Rn in the input amplifiers 16/18 are trimmed to make the Vbe's of the transistors Qn and Qp equal in an attempt to make the input offset of the instrumentation amplifier 10 zero. The Vbe's may be measured directly by probes, or the outputs of the op amps 20 and 22 may be measured, or Vout may be measured during this step. In one embodiment, the measurements are made between trimming increments to avoid overshooting the target.

In all embodiments, the various resistors may be trimmed using any technique. For example, trimming resistors may be performed by turning on or off MOSFETs to connect resistors in series or parallel to achieve the desired resistance.

Due to mismatches in the areas of Qn and Qp, the generated currents through the transistors will be different with the same Vbe, and this will cause the transconductances (gm's) of the input amplifiers 16 and 18 to be different. The equivalent amplifier gm's are also affected by the values of Rfp and Rfn.

In step 44, the output stage resistors R1, R2, R3, and R4 are trimmed (such as made equal) to cancel the common mode voltage and, optionally, components in the op amp 30 are trimmed to remove any offset and achieve a Vout of zero at DC.

The trimming at DC compensates for some component variances throughout the amplifier 10.

Since transistors Qn and Qp and other components are not identical due to process variations, the equivalent transconductances (gm) of the two input amplifiers 16 and 18 will be different. This results in a degraded CMRR vs. frequency.

In step 46, the inputs 12/14 are shorted and a common mode AC signal is applied to the inputs 12/14. Preferably, the frequency of the AC signal is relatively high (e.g., 100 KHz) to create a measurable CMRR (indicated by a non-zero Vout). The frequency should typically be below the specified bandwidth (e.g., 2 MHz) of the instrumentation amplifier 10. In one embodiment, the amplifier 10 is set to have a gain of 0.2-100 during the AC test.

The compensation capacitors Cn and Cp are trimmed while measuring Vout to cause Vout to be approximately zero at the AC test frequency. This sets the bandwidths of both input amplifiers to be equal (e.g., both input amplifiers have the same gain at the test frequency).

This will result in the gm/C ratios of both input amplifiers being equal even though the transconductances and capacitances in both input amplifiers may not match.

The trimming of the capacitors Cn and Cp results in improved CMRR vs. frequency (step 48), and the DC CMRR is not affected.

Trimming capacitors and resistors may be by laser blowing of traces or resistors, high current blowing of traces or resistors, or other well known techniques. In one example, each compensation capacitor is formed by an array of capacitors interconnected by traces or resistors, and the traces or resistive links are cut by a laser to achieve a desired overall capacitance.

The invention has been disclosed in the context of the particular instrumentation amplifier 10 of FIG. 1; however, the invention of the trimming of the compensation capacitors during an AC test may be used on other types of instrumentation amplifiers and non-instrumentation amplifiers. For example, the instrumentation amplifier may output differential signals, where it is desired to have a very high CMRR. In all such embodiments, the trimming of the compensation capacitors in the feedback loop to cause the output to be approximately zero volts at the AC frequency results in equal bandwidths and equal gm/C ratios for both input amplifiers of the amplifier.

In the examples described herein, the input amplifiers 16 and 18 use current feedback; however, the invention also applies to instrumentations amplifiers where their input amplifiers use voltage feedback.

This invention is equally applicable to amplifiers formed using MOSFETs.

While particular embodiments of the present invention have been shown and described, it will be obvious to those skilled in the art that changes and modifications may be made without departing from this invention in its broader aspects. The appended claims are to encompass within their scope all such changes and modifications as fall within the true spirit and scope of this invention.

What is claimed is:

1. A method for improving common mode rejection in an instrumentation amplifier, the instrumentation amplifier having an input section comprising a first input amplifier receiving a first input signal at a first input terminal, and a second input amplifier receiving a second input signal at a second input terminal, the input section outputting common mode and differential signals, the method comprising:

providing a trimmable first capacitor in the first input amplifier and a trimmable second capacitor in the second input amplifier, the trimmable first capacitor and trimmable second capacitor being in respective feedback loops and controlling respective frequency responses of the first input amplifier and second input amplifier;

applying a common mode AC signal to the first input terminal and the second input terminal; and measuring signals in the instrumentation amplifier while trimming at least one of the first capacitor and second capacitor to obtain substantially equal common mode signals at outputs of the first input amplifier and the second input amplifier.

2. The method of claim 1 wherein trimming the at least one of the first capacitor and second capacitor causes a value of the first capacitor to be different from a value of the second capacitor.

3. The method of claim 1 wherein the step of trimming at least one of the first capacitor and second capacitor sets bandwidths of the first input amplifier and second input amplifier to be substantially equal.

4. The method of claim 3 wherein the step of trimming at least one of the first capacitor and second capacitor comprises:

setting gm1/C1 to be approximately equal to gm2/C2, where gm1 is a transconductance of the first input amplifier, and C1 is a value of the first capacitor, gm2 is a transconductance of the second input amplifier, and C2 is a value of the second capacitor, and wherein gm1 does not equal gm2, and C1 does not equal C2.

5. The method of claim 1 wherein the first capacitor and the second capacitor are compensation capacitors.

6. The method of claim 1 wherein the step of trimming at least one of the first capacitor and second capacitor comprises trimming both the first capacitor and the second capacitor.

7. The method of claim 1 wherein trimming is performed by a laser.

8. The method of claim 1 further comprising:

providing at least one trimmable current source element in the input section;

applying a fixed common mode DC signal to the first input terminal and the second input terminal; and trimming the at least one trimmable current source element to obtain a substantially zero DC output of the instrumentation amplifier while applying the fixed common mode DC signal.

9. The method of claim 8 wherein the at least one trimmable current source element comprises a trimmable resistor.

10. The method of claim 1 wherein the step of measuring is performed after incremental trims of the at least one of the first capacitor and second capacitor.

11. The method of claim 1 wherein the instrumentation amplifier further comprises and output section that receives the outputs of the first input amplifier and the second input amplifier and generates a single ended output of the instrumentation amplifier.

12. An instrumentation amplifier comprising:
an input section, the input section comprising:
a first input amplifier receiving a first input signal at a first input terminal;
a second input amplifier receiving a second input signal at a second input terminal;
an output section, the output section comprising:
a differential output amplifier receiving differential inputs corresponding to differential outputs of the first input amplifier and the second input amplifier and outputting an output voltage of the instrumentation amplifier; and
a trimmable first capacitor in the first input amplifier and a trimmable second capacitor in the second input amplifier, the trimmable first capacitor and trimmable second capacitor being in respective feedback loops and controlling respective frequency responses of the first input amplifier and second input amplifier,
the first capacitor and second capacitor having been trimmed during a common mode AC frequency test so as to obtain the substantially zero output of the instrumentation amplifier during the AC frequency test, the first capacitor having a value different from a value of the second capacitor.

13. The instrumentation amplifier of claim 12 wherein a transconductance of the first input amplifier is different from a transconductance of the second input amplifier.

14. The instrumentation amplifier of claim 12 wherein the first capacitor and the second capacitor are trimmed such that bandwidths of the first input amplifier and second input amplifier are approximately equal.

15. The instrumentation amplifier of claim 12 wherein the first capacitor and the second capacitor are trimmed such that gm1/C1 is approximately equal to gm2/C2,
where gm1 is a transconductance of the first input amplifier, and C1 is a value of the first capacitor,
gm2 is a transconductance of the second input amplifier, and C2 is a value of the second capacitor, and
wherein gm1 does not equal gm2, and C1 does not equal C2.

16. The instrumentation amplifier of claim 12 wherein the first capacitor and the second capacitor are compensation capacitors.

17. The instrumentation amplifier of claim 12 wherein the first set of trimmable current source elements comprise trimmable resistors.

18. The instrumentation amplifier of claim 12 further comprising a first set of trimmable current source elements in the input section and output section that have been trimmed during a common mode DC test to cause the output voltage to be substantially zero.

* * * * *